(12) United States Patent
Zafonte et al.

(10) Patent No.: US 7,917,117 B2
(45) Date of Patent: Mar. 29, 2011

(54) AUTO-TUNING AMPLIFIER

(75) Inventors: Steven Zafonte, Seattle, WA (US);
Brian Otis, Seattle, WA (US)

(73) Assignee: University of Washington, Seattle, WA (US)

( * ) Notice: Subject to any disclaimer, the term of this patent is extended or adjusted under 35 U.S.C. 154(b) by 666 days.

(21) Appl. No.: 12/020,805

(22) Filed: Jan. 28, 2008

(65) Prior Publication Data
US 2009/0189697 A1    Jul. 30, 2009

(51) Int. Cl.
*H04B 1/18* (2006.01)
*H03F 3/14* (2006.01)
*H01P 7/00* (2006.01)

(52) U.S. Cl. ........ 455/290; 455/293; 455/340; 455/341; 330/305; 333/235

(58) Field of Classification Search .................. 455/120, 455/125, 188.1, 280, 290, 291, 293, 338, 455/340, 341; 330/305; 333/219, 235; 334/41
See application file for complete search history.

(56) References Cited

U.S. PATENT DOCUMENTS

| | | | |
|---|---|---|---|
| 7,282,998 B2 | 10/2007 | Chen | |
| 7,643,809 B1 * | 1/2010 | Meacham | ................ 455/193.2 |
| 2004/0100330 A1 * | 5/2004 | Chandler | ..................... 330/305 |

OTHER PUBLICATIONS

Kim, Min-Gun, et al., "3V GaAs MESFET Monolithic Transmitter with Cross-Coupled Common-Source, Common-Gate Pair Linear Mixer for Cellular Hand-Held Phones", *1999 IEEE Radio Frequency Integrated Circuits (RFIC) Symposium*, (1999), 207-210.

* cited by examiner

*Primary Examiner* — Nguyen Vo
(74) *Attorney, Agent, or Firm* — Schwegman, Lundberg & Woessner, P.A.

(57) ABSTRACT

This document discloses, among other things, a front end circuit having a selectable center frequency. The center frequency is selected based on a control signal proportional to a phase difference between a reference frequency and an amplifier output. A resonant frequency of a tank circuit coupled to the amplifier is tuned using the control signal.

45 Claims, 9 Drawing Sheets

AUTO-TUNING AMPLIFIER

TECHNICAL FIELD

This document pertains generally to amplifiers, and more particularly, but not by way of limitation, to an auto-tuning amplifier.

BACKGROUND

Portable transceiver devices, such as those found in mobile telephones, typically require coverage for a number of narrow frequency bands. Historically, circuits designed for such low power transceivers have relied on a number of individual front ends with each tuned to a particular frequency band. This approach, however, has drawbacks. Each front end uses an on-chip inductor which occupies a relatively large portion of the available die space. Also, variations in the fabrication process, operating voltage, and operating temperatures, can lead to reduced yield and costly calibration requirements. For these and other reasons, the front end circuits currently used in portable transceivers are inadequate.

OVERVIEW

An example of the present subject matter can be configured to tune a frequency of a resonant circuit using a control loop based on a phase shift through the resonant circuit. The resonant circuit can include, in various examples, a filter, an amplifier, or other module and in this document, the resonant circuit is referred to as a gain stage.

By way of example, a center frequency of a low noise amplifier can be controlled by one or more tunable tank circuits. The tank circuit can include tunable inductors and switched capacitors. The amplifier can be used, for example, in a front end of a radio frequency (RF) transceiver such as that found in a cellular telephone.

A resonant frequency of a tank circuit can be selected using a signal proportional to a phase difference between an amplifier stage output signal and a reference signal. A center frequency of the low noise amplifier is determined by the resonant frequency of the tank circuit.

One example of the present subject matter provides good immunity to variations in process, voltage, and temperature (PVT). In addition, a wide tuning range is provided without the burden of providing individual front ends for each frequency band.

An example circuit as described herein can be configured as an RF receiver with a frequency that can be locked to a center frequency based on a reference frequency. The circuit can be configured as a single frequency band low noise amplifier or as a multi-band low noise amplifier. In addition, an example circuit can be configured to have an input or output impedance which can be matched to another circuit at one or multiple selected frequencies.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
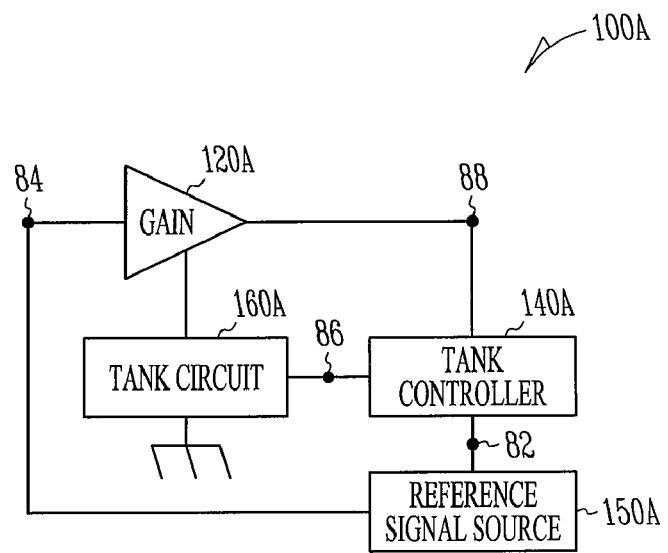
FIG. 1 illustrates a block diagram of an amplifier.

FIG. 1 illustrates a block diagram of amplifier 100A according to one example. In the figure, gain stage 120A receives an input at node 84 and provides an output at node 88. Gain stage 120A is coupled to a resonant circuit, herein referred to as tank circuit 160A. The output at node 88 is coupled to a tank control circuit, herein referred to as tank controller 140A. In addition, reference signal source 150A provides an output to tank controller 140A (at node 82) and an output at node 84. An output of tank controller 140A is coupled, at node 86, to control input of tank circuit 160A.

Tank circuit 160A can be used for impedance matching of inputs or impedance matching of a load section of an amplifier, and in this example, is shown coupled to the gain stage. Tank circuit 160A can be coupled to a gain stage in various manners, including, for example, at the input to the gain stage, at the output of the gain stage, or at an intermediary location in the gain stage. In various examples, the tank circuit can be coupled in a drain circuit, a source circuit, or a gate circuit of a field effect transistor (FET). A resonant frequency of the tank circuit determines the center frequency of the gain stage. One end of the tank circuit is coupled to a ground potential or other reference level.

Reference signal source 150A provides two outputs, one of which is provided to the input of gain stage 120A and the other of which is provided to tank controller 140A. A phase difference between the reference signal, as seen at node 82, and the amplified signal, as seen at node 88, is used by tank controller 140A to generate a correction signal on node 86. The correction signal at node 86 is used to adjust a resonant frequency of tank circuit 160A. A center frequency of gain stage 120A is determined by the resonant frequency of tank circuit 160A.

Reference signal source 150A, in various examples, provides a current output reference and a voltage output, two current outputs, or two voltage outputs. In one example, the signal at node 82 is a voltage and the signal at node 84 is a current. The two outputs from reference signal source 150A can differ in phase from −180 degrees to +180 degrees.

Gain stage 120A can include a low noise amplifier or a portion of a filter and can have either single or differential inputs and outputs. Gain stage 120A can include multiple sections or a single section. In one example, gain stage 120A includes an RF amplifier.

Consider the operation of circuit 100A schematically illustrated in FIG. 1. In the example shown, reference signal source 150A provides a reference signal that is applied to an input of gain stage 120A. Using tank controller 140A, a signal at the output of gain stage 120A is compared with a signal provided by reference signal source 150A. Tank controller 140A, in the example illustrated, provides a DC output signal that is related to a phase difference between the gain stage output and the reference signal source.

The present subject can be configured to operate in a homodyne mode (in which the phase comparison is done at the center frequency of the amplifier or a sub-harmonic of that frequency) or in a heterodyne mode (in which the reference signal and output are shifted to a more convenient frequency to make the phase comparison).

The DC phase detector output signal can be described as an error signal. The tank controller provides an output, at node 86, that adjusts the resonant frequency of tank circuit 160A. The resonant frequency of tank circuit 160A is adjusted in a manner to bring the amplifier center frequency closer to the frequency of the reference signal (along with any offset).

Figure 2:
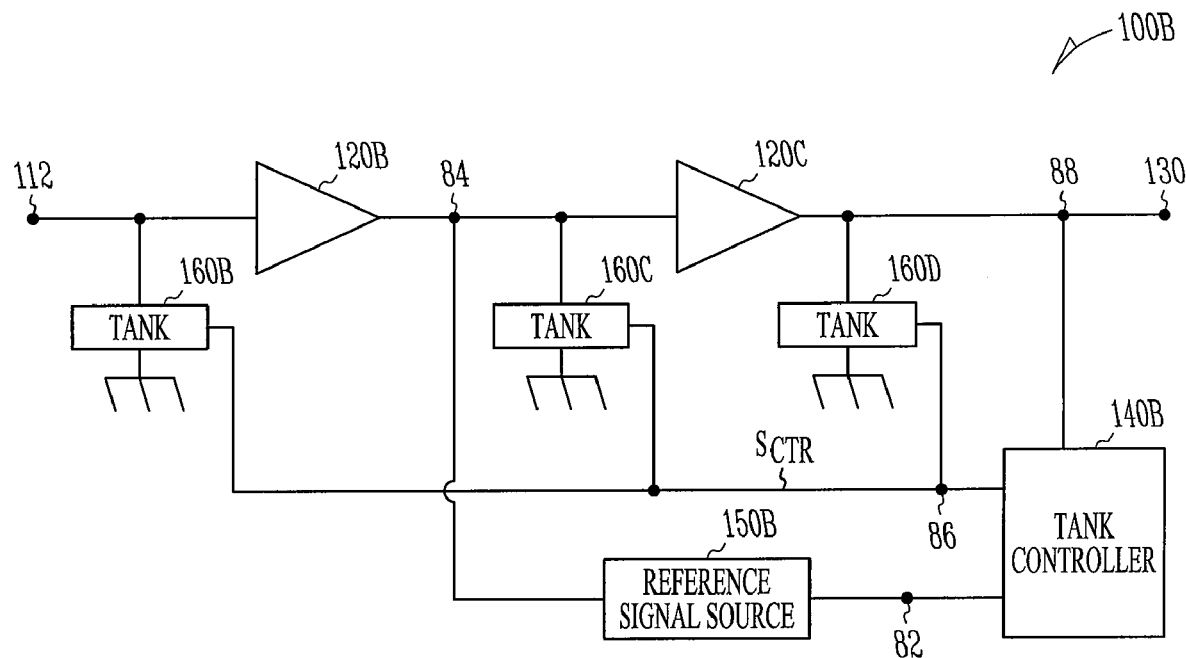
FIG. 2 illustrates a schematic of a multi-stage amplifier.

FIG. 2 illustrates a schematic of a multi-stage amplifier 100B having input 112 and output 130. Amplifier 100B includes gain stage 120B and gain stage 120C coupled in series. Tank circuit 160B, at input to gain stage 120B, tank circuit 160C at input to gain stage 120C, and tank circuit 160D at output of gain stage 120C are identical matching circuits (replicas) each having a variable resonant frequency.

Reference signal source 150B provides a reference signal to node 84 at the input of gain stage 120C and also provides a reference signal to node 82 at the input of tank controller 140B. Tank controller 140B also receives an input from node 88 at the output of gain stage 120C.

Tank controller 140B provides an output at node 86 coupled to tank circuit 160B, tank circuit 160C, and tank circuit 160D. The control signal on node 86 is sometimes referred to as $S_{CTR}$ and can include any combination of an analog signal, a digital signal, or a combination of analog and digital signals.

Figure 3A:
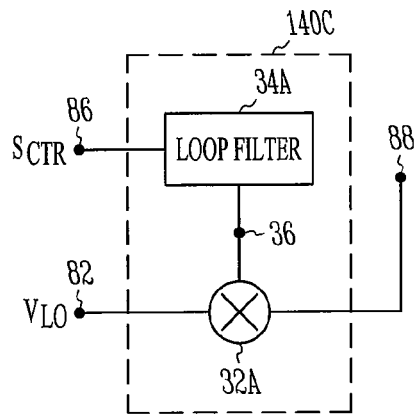
FIGS. 3A and 3B illustrate schematics of tank controllers.

FIG. 3A illustrates an example of tank controller 140C. Tank controller 140C includes phase detector 32A and filter 34A. Phase detector 32A is configured for homodyne operation.

Phase detector 32A receives an input from node 88 (output of a gain stage) and node 82 (output of a reference signal source, such as a local oscillator). In one example, phase detector 32A provides an output signal, on node 36, that is proportional to a difference in phase as to a signal on node 82 and a signal on node 88. The phase relationship between the reference signal and the gain stage can be determined using a mixer or a phase detector. Phase detector 32A can include a frequency mixer or analog multiplier circuit. Detector 32A generates a current or voltage signal which represents the difference in phase between two signal inputs.

In other examples, the phase detector provides an output signal, on node 36, that bears some relationship to a difference in phase as to the signal on node 82 and the signal on node 88. For instance, the relationship can be linearly related or non-linearly related.

Filter 34A generates an output at node 86 based on the input signal on node 36. In one example, filter 34A, also referred to as a loop filter, serves to filter the output from phase detector 32A and create a stable lock that converges at the correct frequency. In one example, filter 34A includes a differential amplifier and an integrator.

The control signal provided by the tank controller and to the tank circuit can take a variety of forms. For example, the control signal can include a modulated analog signal on a line, an encoded digital signal, a bus having a number of digital lines, or a combination of digital and analog signals. In one example, the tank controller includes circuitry to implement a digital controller and is configured to generate a digital control signal.

Figure 3B:
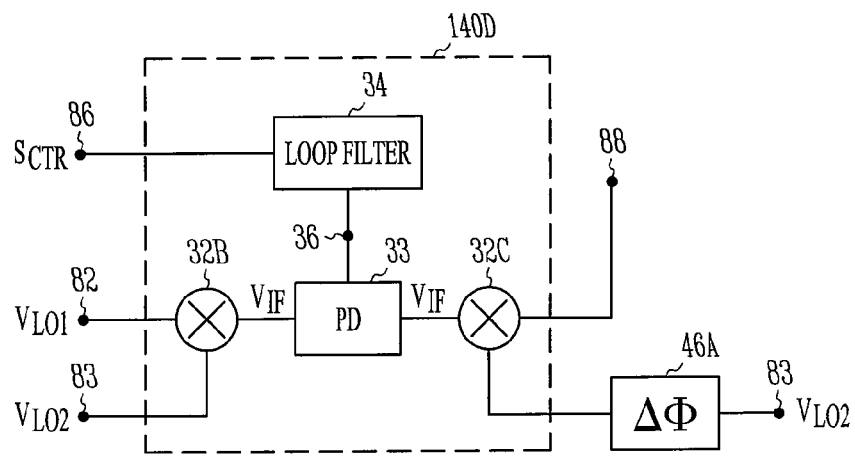

FIG. 3B illustrates an example of tank controller 140D configured for heterodyne operation. Tank controller 140D includes multiplier 32B, multiplier 32C, and phase detector 33 arranged to operate in a heterodyne configuration. As noted earlier, a phase detector can include a frequency mixer or analog multiplier circuit. Multiplier 32B receives a first local oscillator signal on node 82 and a second local oscillator signal on node 83. In the example illustrated, the output of multiplier 32B is a voltage that represents the intermediate frequency which is provided to an input of phase detector 33. In addition, multiplier 32C receives a signal on node 88 (which corresponds to the amplifier output), and a phase shifted (through phase shifter 46A) signal from the second local oscillator signal, also denoted as node 83. The output of multiplier 32C is provided to an input of phase detector 33. The output of phase detector appears at node 36 which is provided to loop filter 34. Multiplier 32B and multiplier 32C allow the frequency to be raised or lowered.

In FIG. 3B, phase shifter 46A is shown beyond the boundaries of the dashed line. The dashed lines of this and the other figures, however, are for organizational purposes only and are not to be construed as limiting the location of any particular component. Note, for example, that phase shifter 46B, of FIG. 4, can also be viewed as part of reference signal source 150C.

Figure 4:
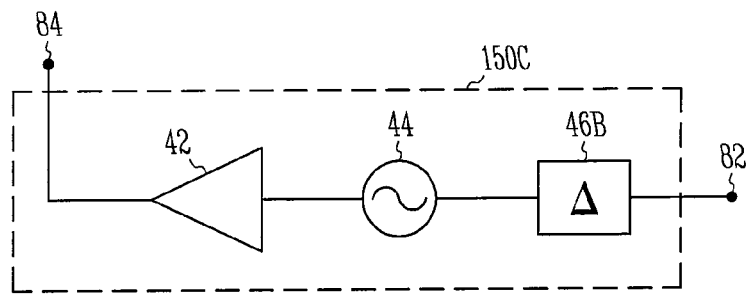
FIG. 4 illustrates a schematic of a reference signal source.

FIG. 4 illustrates reference signal source 150C having an output at both node 84 and at node 82. Oscillator 44 provides a stable reference signal having a single frequency. In various examples, oscillator 44 includes a local oscillator, a synthesizer, or other circuit configured to provide a reference frequency.

In the figure, oscillator 44 has one output coupled to buffer 42 and another output coupled to phase shifter 46B. Buffer 42 provides isolation, and in various examples, provides attenuation (negative gain) or amplification (positive gain). An output from buffer 42 is provided at node 84. Phase shifter 46B provides a phase shifted version of oscillator 44 output at node 82. In one example, phase shifter 46B provides 90 degrees of phase shift. Phase shifter 46B can be configured to provide other amounts of shift, including, for example, 45 degrees. An amount of shift can be selected for the phase shifter to cause the frequency to lock on a particular target frequency or displaced to one side by a selected amount.

Figure 5:
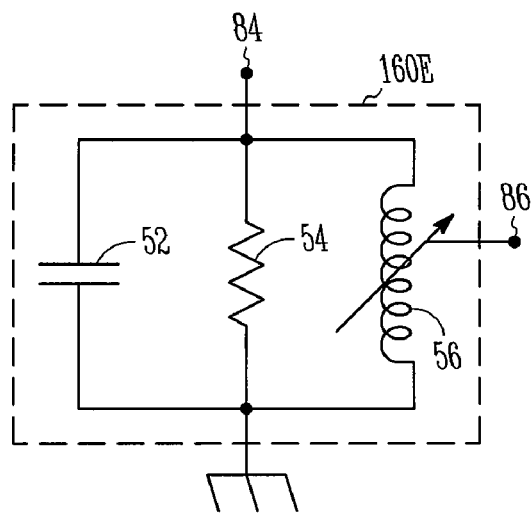
FIG. 5 illustrates a schematic of a tank circuit.

FIG. 5 illustrates tank circuit 160E. In the figure, tank circuit 160E includes a resonant circuit and is depicted as a parallel connection of capacitor 52, resistor 54, and inductor 56. The components shown in the schematic can represent actual or parasitic components. Tank circuit 160E resonates at a frequency determined by the capacitance value and the inductance value of the components. At a resonant frequency, the tank circuit appears as a pure resistance having no reactive component.

At least one component of tank circuit 160E is adjustable and thus, the resonant frequency is adjustable. In the figure, inductor 56 is denoted as having a variable inductance, however capacitor 52 can also be made variable. A signal on node 86 determines the resonant frequency of tank circuit 160E. In the figure, tank circuit 160E is coupled to node 84 and also coupled to a reference potential, which, in various examples, includes a ground or other reference voltage.

In the figure, tank circuit 160E includes passive electrical components, however, one or more of the components shown can be replaced with an active component or active circuit that is fabricated, for example, using a semiconductor manufacturing process. For example, tank circuit 160E can include a varactor, a variable capacitor (such as a switched capacitor or a tunable capacitor), or a variable inductor (such as a switched inductor or a tunable inductor). The variable inductor can include, for example, a capacitor or inductor tuned through an active variable gain element. A capacitor can be tuned through the Miller Effect by varying the gain of a parallel voltage amplifier. Likewise, an inductor can be tuned by varying the current gain through two windings of a tightly coupled transformer. The tank circuit can include one or more components fabricated using a metal-oxide-semiconductor (also known as MOS), bipolar MOS (also known as BiCMOS), silicon-germanium (SiGe), gallium arsenide (GaAs), or any of a number of other fabrication technologies. For example, a tank circuit can be included on a monolithic microwave integrated circuit (MMIC). In one example, the tank circuit includes a transmission line.

In one example, a number of tank circuits are fabricated on a single semiconductor chip and are said to be replicas of each other. The fabrication process assures that each tank circuit will, to a high degree, be identical replicas of each other tank circuit. Note, however, that the different tank circuits can be coupled to different reference voltages (such as gnd and vdd). In addition, different tank circuits can have resistors that differ without altering the center frequency.

An example of the present subject matter includes a low noise amplifier that can be tuned across a wide band of frequencies. The center frequency of the amplifier can be accurately tuned based on a frequency provided by a local oscillator or by a synthesizer.

One example of the present subject matter operates in manner that can be described as a master-slave relationship. The one or more tank circuits are adjusted as a unit in accordance with a detected phase difference between the output of the amplifier and the reference signal source. The reference signal source provides a calibration reference to the master circuit. The slave circuit is adjusted with the same control signal as the master although it does not see the reference signal. In one example, one tank circuit of the amplifier is a replica of another tank circuit and the center frequency of the amplifier can be adjusted by changing the resonant frequency of the tank circuits.

The present subject matter is largely immune to variations in manufacturing process, operating voltage and temperature variations. One example allows an amplifier to lock onto a particular phase difference and provide a tuned amplifier suitable for use as a low noise front end for a receiver.

Some of the components used in the present subject matter can fulfill a dual role. In particular, some components (or modules) of the present subject matter can be used for other components in a typical receiver. For example, an output from the local oscillator in an RF receiver can be used as the reference signal source. For example, a mixer used in a receiver front end can also be used as a detector and the reference signal can be drawn from a local oscillator (LO). In some receivers, a mixer is driven by an in-phase (I) local oscillator signal and a quadrature (Q) local oscillator signal that is displaced by a 90 degree phase shift relative to the I signal. The phase shift can be provided by a quadrature LO signal such as that provided by a quadrature voltage controlled oscillator (QVCO) or a polyphase filter.

In one example, a constant offset is used between the resonant frequency and the reference signal frequency. The offset can be selected to cancel out the effects caused by the parasitic phase through the circuit (assuming the phase comparator is an analog multiplier). For example, with a 0.4 GHz offset, the reference frequency is set at 2.5 GHz to provide a target amplifier center frequency of 2.1 GHz. Assuming the phase detector is an analog multiplier, and the remainder of the circuit introduces no phase lag and the 90 degree phase shifted signal is used as the reference in the multiplier, then the tank circuit is set to resonate at the target frequency.

In various examples, phase detector 32A (or phase detector 32D) includes a mixer, a multiplier, or other type of detector that generates a signal representative of a difference in phase between the two signal inputs.

Figure 6:
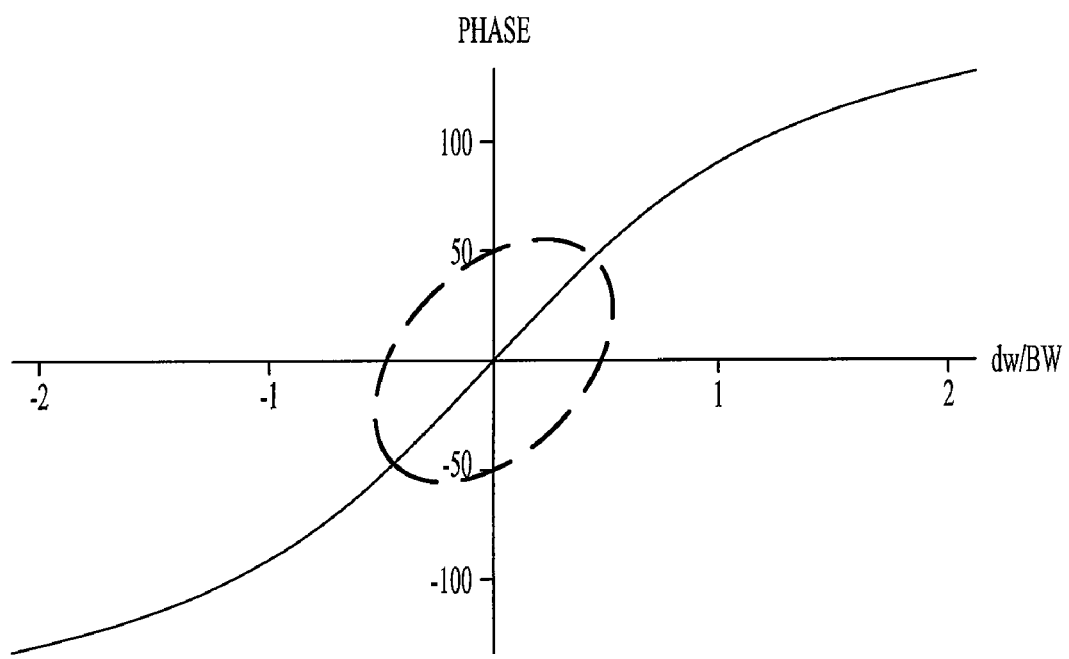
FIG. 6 illustrates a phase diagram for an amplifier.

FIG. 6 graphically illustrates phase as a function of frequency normalized to bandwidth for a low noise amplifier. As noted in the graph, phase differences are linear in the region near the resonant frequency, and at resonance, the phase shift is zero. The figure illustrates performance using a two-stage amplifier. The slope of the graph at resonance becomes steeper with increasing number of gain stages.

The derivative of the phase with respect to frequency can be expressed as:

$$\frac{d\phi}{d\omega} \approx \frac{180}{\pi}(Q_1 + Q_2 + Q_3 + \dots) \cdot (\omega_{res} - \omega)$$

A signal proportional to phase is used as a loop error signal for a phase locked loop (PLL) and can be used to lock the amplifier center frequency onto resonance.

The amount of offset is a function of the number of stages and is proportional to the inverse of Q. The reference frequency and the particular resonant frequency of the tank circuit is substantially matched when it is within a few 3 dB bandwidths of the resonant structure. In one example, the amplifier center frequency is tuned to a frequency having a power within 5 dB of the resonant frequency of the tank circuit.

A transfer function can be used to describe the relation between the input and output of the gain stage. In particular, the center frequency of the gain stage can be inferred from the transfer function. In various examples of the present subject matter, the tank circuit of the gain stage is adjusted based on a detected phase and the amount of injected signal (or tank controller gain) is adjusted according to the detected amplitude.

In one example, an amplitude of the amplifier transfer function is detected and used to provide a control signal. Near the center frequency, the amplitude exhibits a quadratic relationship. A derivative of the amplitude function can be used to provide a control signal, however, this may produce a loop error. The derivative information is a derived quantity which can lead to a dead band which may frustrate the frequency lock. In addition, the amplitude detection may be prone to stability problems because it is sensitive to the gain setting of the amplifier.

Other portions of this document describe examples in which the phase of the amplifier is used to generate the control signal for the tank circuit.

In one example, both the phase and amplitude of the transfer function are detected and used to provide a control signal to the tank circuit. The phase difference may be suited for making changes in the resonant frequency of the tank circuit and the amplitude of the signal can be used for control of the control loop gain.

Figure 7:
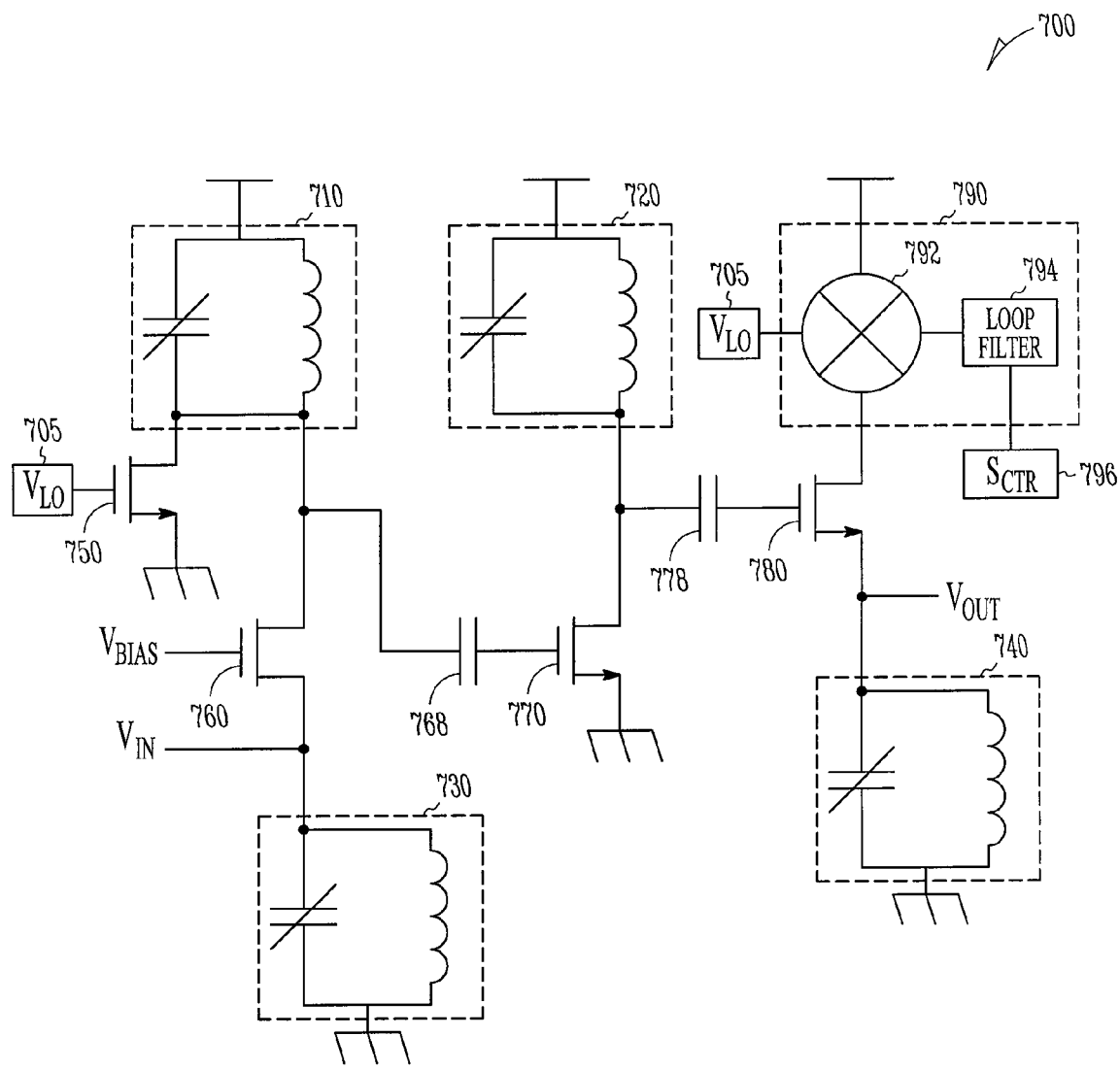
FIG. 7 illustrates a schematic of an amplifier using field effect transistors.

The present subject matter can be implemented using gain stages provided by field effect transistors. FIG. 7 illustrates a schematic of amplifier 700 using field effect transistors. In the figure, a reference signal frequency is provided by a local oscillator here denoted as source 705, which is injected at two locations in the circuit. Tank circuit 710, tank circuit 720, tank circuit 730, and tank circuit 740 are replica circuits, with each having an adjustable capacitance. Transistors provide the three gain stages in this circuit and are denoted as transistor 760, transistor 770, and transistor 780.

The reference signal from source 705 is injected at transistor 750 and at the detector 792 of the tank controller 790. Transistor 760 receives a bias voltage and the amplifier input signal. Capacitor 768 and capacitor 778 provide inter-stage coupling. Transistor 780 provides an amplifier output signal and also provides a signal to detector 792. Tank controller 790 also includes loop filter 794 which provides the correction signal denoted as $S_{CTR}$ 796. Control signal $S_{CTR}$ 796 can include a voltage (direct current or alternating current), a current (DC or AC), a digital signal or a combination of a digital and analog signal configured to adjust the resonant frequency of tank circuit 710, tank circuit 720, tank circuit 730, and tank circuit 740. The controllable elements of the tank circuits are denoted with a diagonal line and the connection between $S_{CTR}$ and the tank circuits are omitted in the figure for purposes of clarity.

Circuit 700, as illustrated in the figure, includes a matched 50 ohm input/output RF tunable amplifier having low noise and a wide tuning range.

Other applications (in addition to RF circuits) are also contemplated. For example, the circuit can be configured for operation using a microwave signal. In such a circuit, the tuning of the tank circuit is controlled for use with an input signal in the microwave spectrum.

Figure 8:
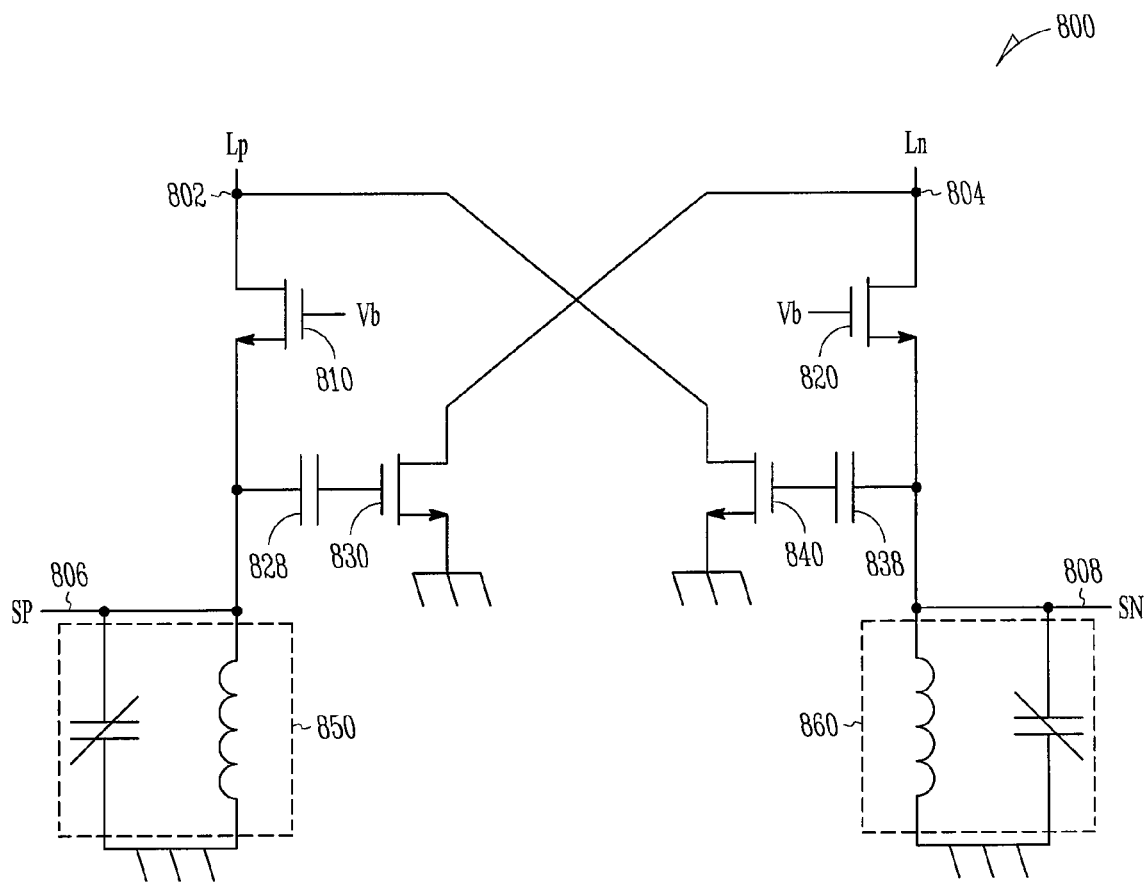
FIG. 8 illustrates a schematic of a hybrid CG/CS amplifier.

FIG. 8 illustrates circuit 800 for a hybrid common gate/ common source (CG/CS) amplifier having differential input and differential output. In circuit 800, CG amplifier (provided by transistor 810 and transistor 820) receives the input signal positive (at 806) and signal negative (at 808). In addition, CS amplifier, as provided by transistor 830 and transistor 840, also are coupled to signal positive 806 and signal negative 808, respectively. The drain of transistor 810 and drain of transistor 840 are coupled to load positive 802 and the drain of transistor 820 and drain of transistor 830 are coupled to load negative 804. The gates of transistor 830 and transistor 840 connect to coupling capacitor 828 and coupling capacitor 838, respectively. DC biasing circuitry can take various forms and is not treated exhaustively in this document. Tank circuit 850 and tank circuit 860 include an adjustable element used to tune a resonant frequency. In the figure, the adjustable element includes a capacitor, however, other reactive components (passive or active) can also be adjusted to tune the resonant frequency. Tank circuit 850 and tank circuit 860 are both coupled to a tank controller not shown in the figure.

A single-ended-to-differential amplifier can include inputs of the CG amplifier and inputs of CS amplifiers connected together and drains/collectors of the transconductors attached to separate loads or to a differential load. A standard differential pair can serve as an additional gain stage.

The circuits illustrated herein can be fabricated using other technology. For example, when using bipolar junction (BJT) devices, the gates are replaced by bases and the sources are replaced by emitters and the drains are replaced by collectors. When using BiCMOS, either or both transconductors can be BJT devices. In one example, cascode devices are used.

The reference signal can be injected into the multiple gain stages at any of a plurality of sites. For example, the reference signal can be injected at an input to a first stage or a later stage. In addition, the amplifier transfer function can be examined by monitoring an output signal at some location downstream of the injection site. The site of the output signal can be selected as the last stage in a multi-stage amplifier or any prior stage in the amplifier that is downstream of the reference signal injection site.

Other options for injecting the reference signal also exist. For example, a test signal can be simultaneously injected into multiple gain stages for a flatter gain response far off resonance. As another example, the test signal can be sequentially injected into different gain stages to tune an amplifier. In one particular example, the test signal is injected into a last gain stage in a series, then that stage is tuned, and in turn, successively earlier gain stages receive the injected signal and are tuned until the whole amplifier is tuned.

If a fixed offset is used, then simulation of the chosen topology can provide a first order correction to the frequency between the reference frequency at lock and the resonant frequency of the replica tank circuit. If a quadrature signal is used, then the reference signal source can be tuned directly to the center of the tank circuit. In one example, a phase offset of 90 degrees (plus or minus) is selected, in this case, if there are no other phase shifts, the signal source or tank controller can omit the phase shifter.

Figure 9:
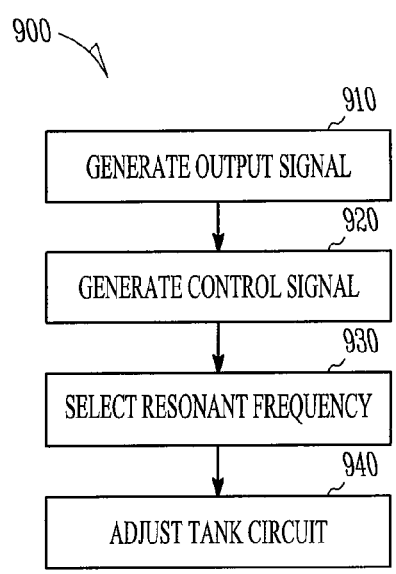
FIG. 9 illustrates a method according to an example of the present subject matter.

FIG. 9 illustrates method 900 for operating an example of the present subject matter. At 910, an output signal is generated using the gain stage, amplifier, or other circuit. As a function of the circuit configuration and components, including such variables as process, voltage and temperature, the circuit will exhibit a particular center frequency. The center frequency of the circuit is adjustable based on the resonance frequency of the tank circuit. As noted, the tank circuit can be at an input, an output or at an intermediary portion of the circuit.

At 920, a control signal is generated. The control signal, in one example, uses the output signal and a reference signal source. For instance, a phase difference between a frequency of the output signal and a frequency of the reference signal can be used to generate a control signal. The control signal, in one example, is a direct current signal having a voltage (or current) level related to the phase difference. The control signal, sometimes referred to as $S_{CTR}$, can include an analog signal encoded as a voltage (AC or DC), an analog signal encoded as a current (AC or DC), a digital signal (encoded on a bus or on a digital signal single line), or a combination of analog or digital signals.

At 930, the control signal is used to determine a resonant frequency of at least one tank circuit. At least one tank circuit includes a reactance having a value that is selectable based on the control signal in the absence of other parasitics. The reactance can include a variable capacitor, a variable inductor, or both a variable capacitor and a variable inductor. The resonance frequency of the tank circuit is proportional to the reciprocal of the square root of the capacitance.

At 940, the tank circuit is adjusted to shift the resonant frequency in a manner that reduces the phase difference between the output signal and the reference signal. The injected signal is variously referred to as a test signal or a reference signal. The tank circuit is adjusted by changing a value of a capacitance, by changing a value of an inductance, or by changing a value of both a capacitance and an inductance.

The present subject matter can be configured as a cross-coupled common gate front end.

Figure 10A:
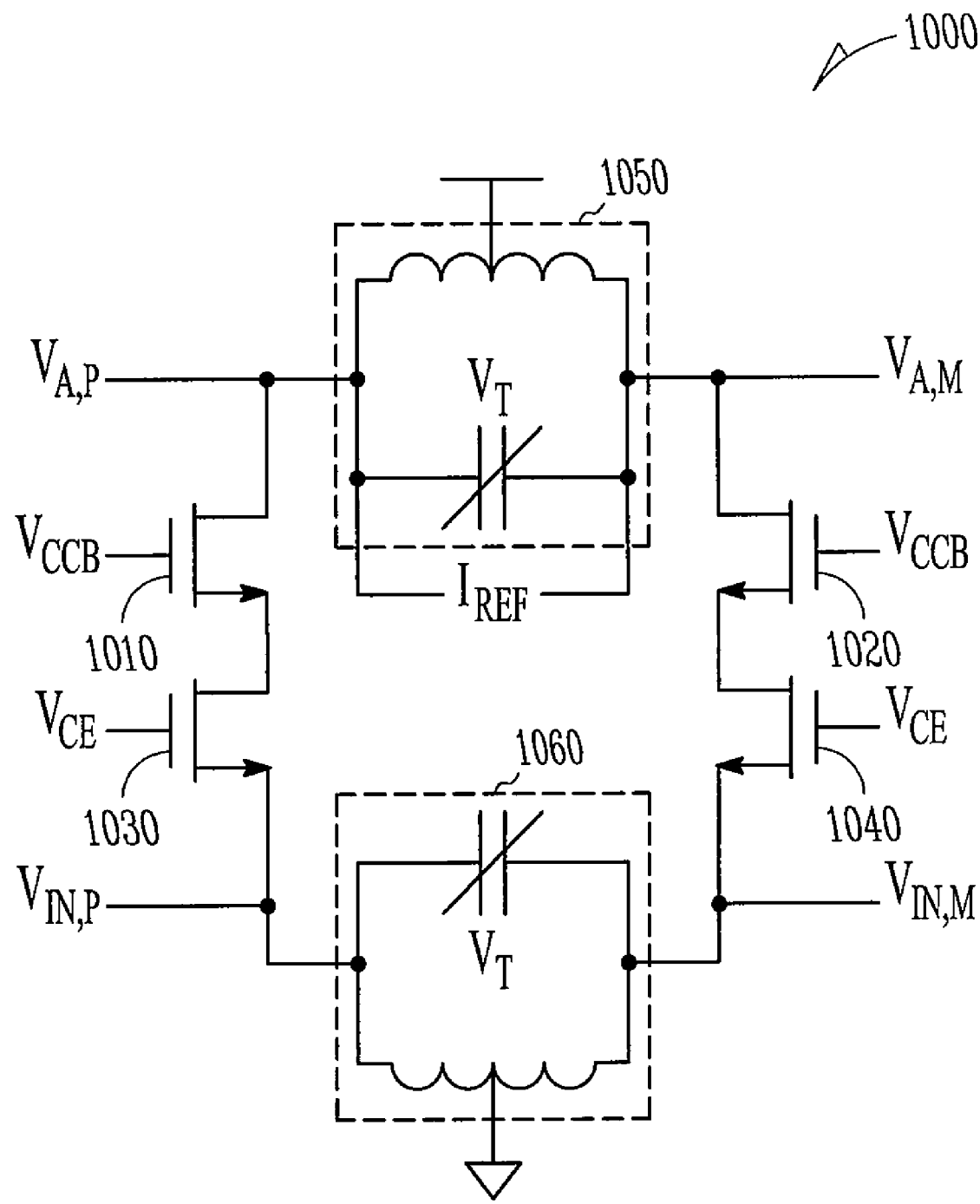
FIGS. 10A, 10B, and 10C illustrate a schematic of an amplifier.
Figure 10B:
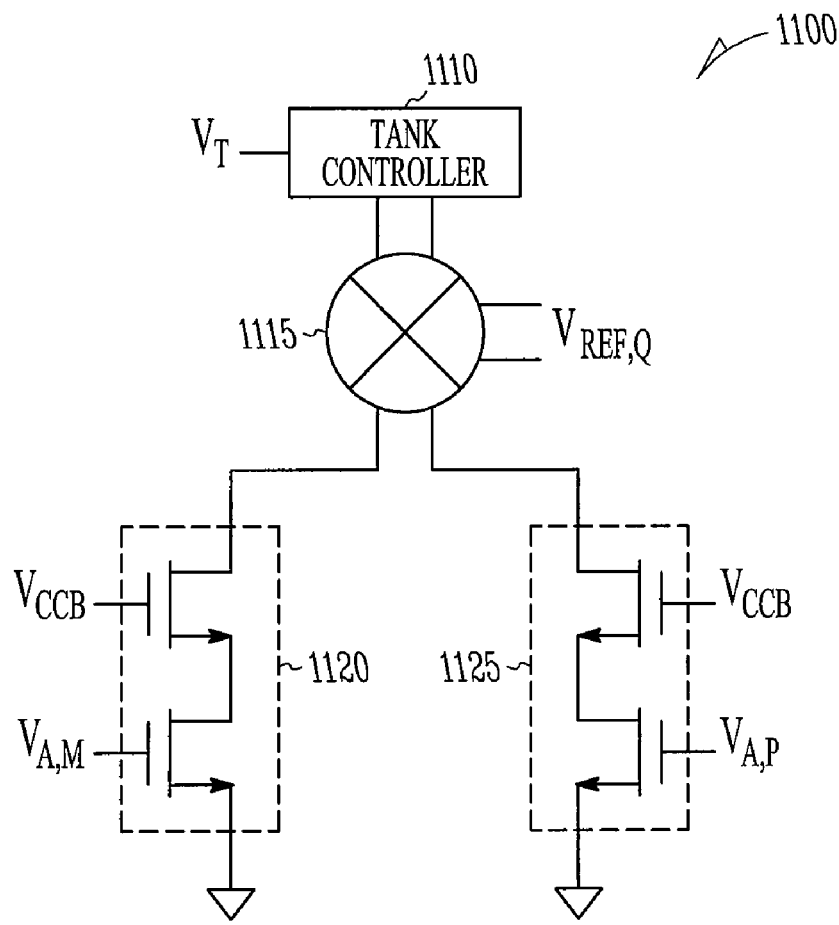
Figure 10C:
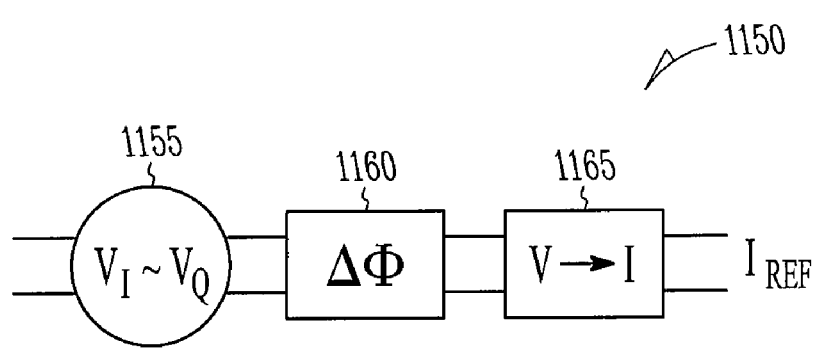

FIG. 10A, FIG. 10B, and FIG. 10C illustrate portions of an amplifier according to the present subject matter. FIG. 10A illustrates circuit 1000 having tunable tank circuit 1050 and tunable tank circuit 1060. In the figure, tank circuit 1050 and tank circuit 1060 include a fixed inductor and an adjustable capacitor. The capacitance of the adjustable capacitors, and thus the resonant frequency of the tank circuits, are determined by a control signal, here denoted as $V_T$. Tank circuit 1050 receives current $I_{ref}$ and is coupled to $V_{A,P}$ (positive) and $V_{A,M}$ (minus or negative). Tank circuit 1060 is coupled to $V_{IN,P}$ (positive) and $V_{IN,M}$ (minus or negative). Transistor 1010 and transistor 1030 are connected in series between $V_{A,P}$ and $V_{IN,P}$. Transistor 1020 and transistor 1040 are connected in series between $V_{A,M}$ and $V_{IN,M}$. The gate of transistor 1010 and the gate of transistor 1020 are connected to a common reference and the gate of transistor 1030 and the gate of transistor 1040 are also connected to a common reference.

In FIG. 10B, control signal $V_T$ of circuit 1100 is provided by tank controller 1110. Tank controller 1110 receives a differential signal from differential detector 1115. the differential signal received by tank controller 1110 is proportional to differential signal $V_{ref,Q}$ and a differential signal provided by series transistors 1120 and series transistors 1125. In the figure, series transistors 1120 and series transistors 1125 are cascode pairs, and receive $V_{A,M}$ and $V_{A,P}$, respectively.

FIG. 10C illustrates circuit 1150 configured to provide current $I_{ref}$. In the figure, circuit 1155 receives a differential signal which may be in quadrature ($V_I$ and $V_Q$ are 90 degrees, or a quarter period apart with the I-phase signal $V_I$ either leading or lagging the Q-phase signal $V_Q$). Phase offset is provided by phase shifter 1160 and an output voltage is translated to a current by circuit 1165.

Figure 11A:
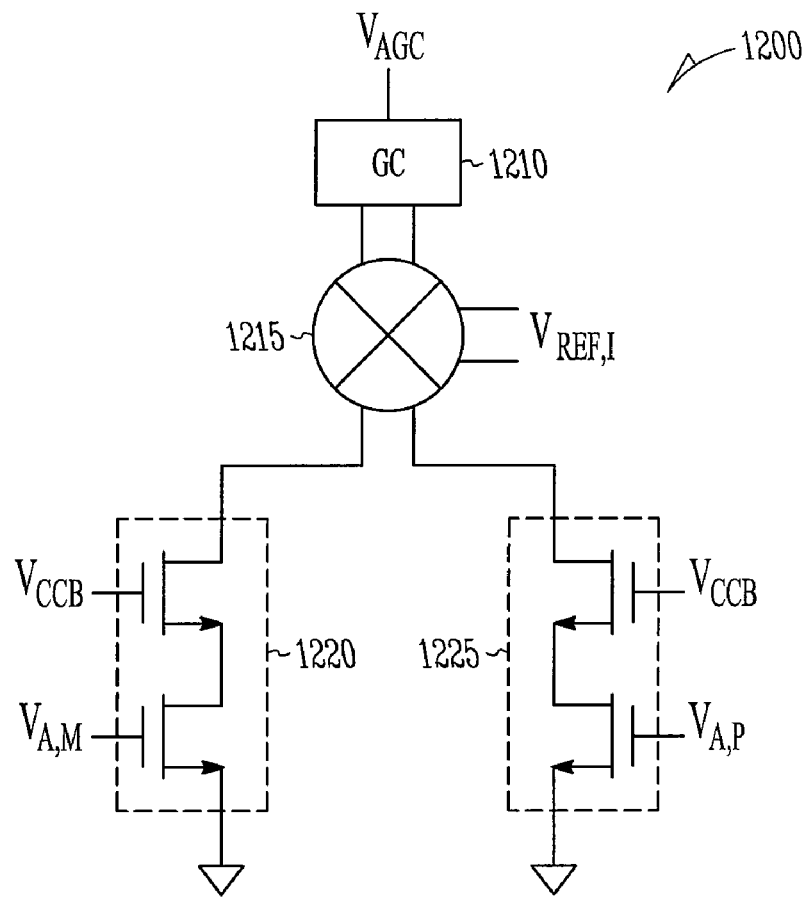
FIGS. 11A and 11B illustrate a schematic of an amplifier.

FIG. 11A illustrates circuit 1200 having cascode transistors 1220 and transistors 1225 which are coupled to differential detector 1215. Detector 1215 also receives differential $V_{ref,I}$ and provides a differential signal to gain controller 1210. Gain controller 1210 provides automatic gain control voltage $V_{AGC}$, which in various examples can be an analog voltage, a digital voltage, or other type of control signal as described elsewhere in this document with respect to $S_{CTR}$.

Figure 11B:
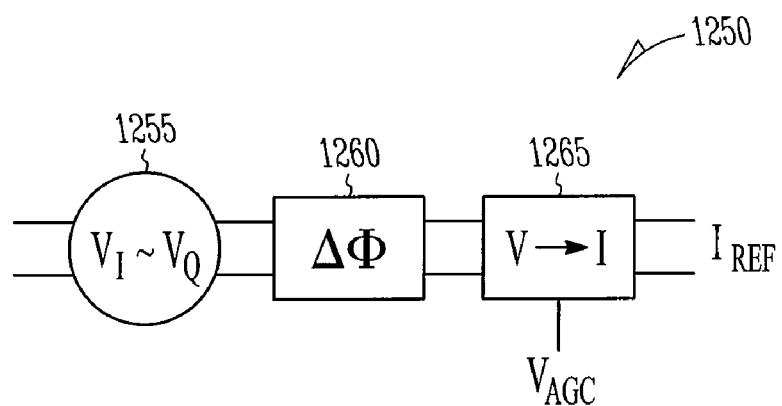

Circuit 1250 of FIG. 11B corresponds to circuit 1150 of FIG. 10C with the addition of input $V_{AGC}$ to voltage to current converter circuit 1265 as shown. In particular, circuit 1255 generates a differential signal which may be in quadrature ($V_I$ and $V_Q$ are 90 degrees, or a quarter period apart with the I-phase signal $V_I$ either leading or lagging the Q-phase signal $V_Q$). Phase offset is provided by phase shifter 1260 and an output voltage is translated to a current by circuit 1265.

The circuits of FIG. 10 and FIG. 11 are examples of pseudo-differential amplifiers having greater headroom than that of a differential circuit with a tail current source. The circuits can be adapted for full differential operation as well.

Some phase is lost in the cascode node. This can be modeled by a simulator and inaccuracy arising from PVT will be of a second order. These losses can be compensated for by adjusting the phase shifter, by selecting $V_{ref}$ at a frequency offset from the target circuit center frequency, or by adjusting both the phase shifter and $V_{ref}$.

In at least one example, a compensation capacitor is used. The compensation capacitors are used in a master-slave architecture and are selected based on parasitic factors and inaccuracies due to drain/source/gate asymmetries. A value for the compensation capacitor can be found experimentally, by simulation, or by other methods.

Figure 12:
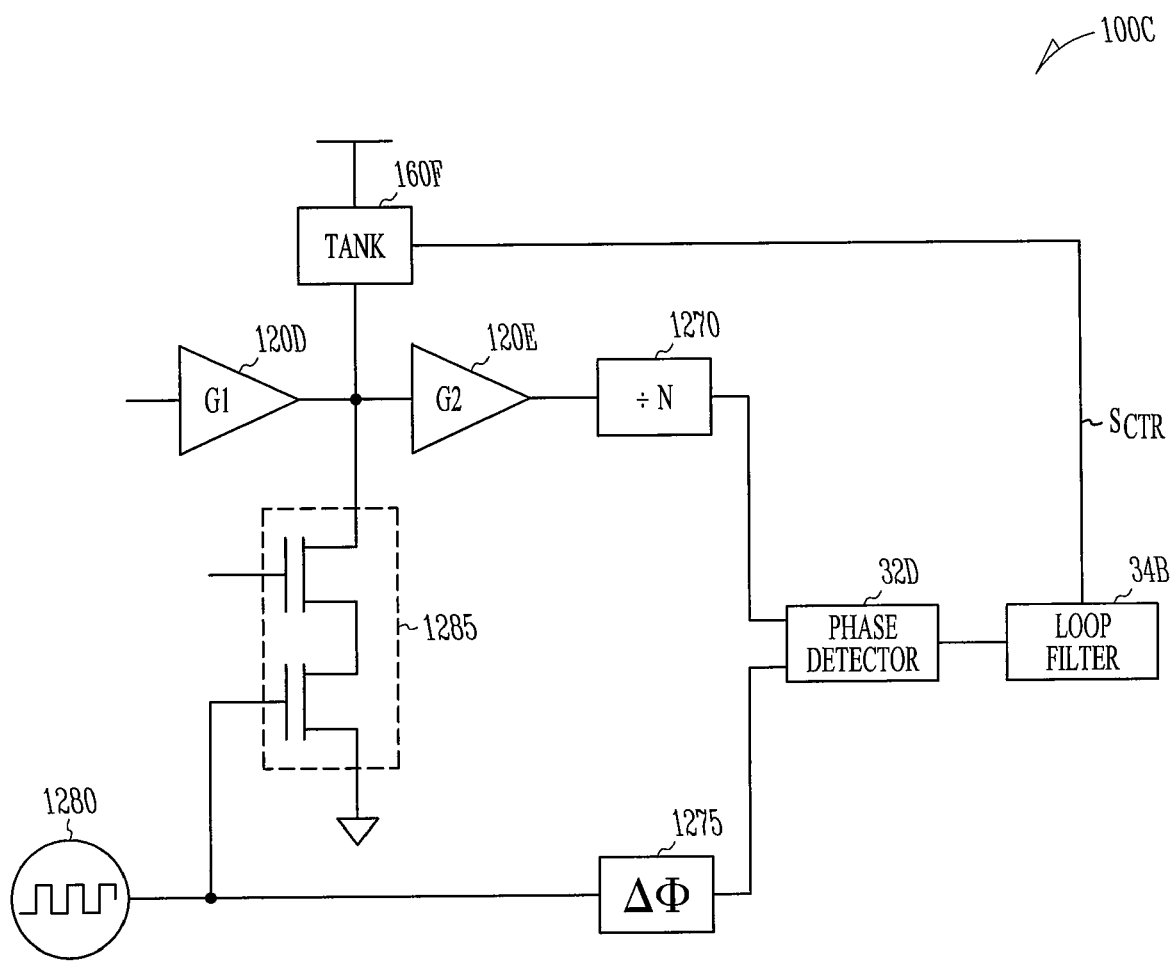
FIG. 12 illustrates a block diagram of a circuit.

FIG. 12 illustrates a block diagram of circuit 100C. In the figure, the reference signal, provided by source 1280, is injected as a square wave current at the $N^{th}$ sub-harmonic of the target amplifier frequency, that is f(0)/N. The harmonic content of the injected signal excites tank circuit 160F at the frequency f(0) through cascode transistors 1285. The output of the amplifier (as seen through gain stage 120D and gain stage 120E) is put through divide-by-N circuit 1270, after which the phase is compared (at phase detector 32D) with a phase shifted (by phase shifter 1275) reference signal. The output of phase detector 32D is sent to loop filter 34B which outputs a control signal ($S_{CTR}$) for tank circuit 160F. Circuit 100C uses no local oscillator and no mixing to DC is needed in the control loop.

Circuit 100C uses a phase difference to tune the circuit but rather than comparing at the same frequency, this circuit illustrates injecting a signal with phase coherent harmonic content. The divider circuit (divide-by-N circuit 1270) brings the amplifier output back down to the fundamental of the injected signal. Phase detection is then conducted at a lower frequency which, in some circuits, requires less power. In addition, for some applications, it is convenient to generate and provide a square wave (such as the output of a dual modulus divider in a fractional synthesis system, possibly with noise shaping).

ADDITIONAL EXAMPLES

A circuit as described herein, when configured as a tunable narrowband amplifier, provides satisfactory performance at a low power along with relaxed requirements for linearity and a lower noise. In addition, the wide tuning range of the present subject provides the flexibility of a wideband amplifier.

In one example, an amplitude of the signal through the amplifier is modulated to adjust the gain of the loop. In one example, the in-phase signal is mixed with the RF signal to generate a reference amplitude from the two signals and the reference amplitude is used to modulate the gain for the control loop.

The tuning loop of the present subject matter, including the tank controller and the adjustable tank circuits, can be operated continuously or on an as-needed basis. Continuous operation of the tuning loop can be used in applications having a frequency of the reference signal source that is offset from the target band. The tuning loop can be operated on an as-needed basis when, for example, a temperature change is detected, a voltage change is detected, or when a frequency band is changed.

When operating at a frequency that is significantly different than the resonant frequency of the one or more tank circuits, the loop gain may be too low. In one example, the reference signal source includes a PLL used to control the frequency of the reference signal source and the tuning loop time constant can be selected to be faster than that of a synthesizer of the PLL. The tuning loop characteristics are rather tolerant and need not converge too closely to the target value.

The present subject matter can be used with a low noise amplifier having a fixed or variable gain.

The reference signal can be provided by various circuits. In one example, a reference signal is provided by a circuit having a slew rate that is limited such that a gain of the controller remains above a selected level.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A circuit comprising:
   a tank circuit coupled to an amplifier, wherein a center frequency of the amplifier is determined using a resonant frequency of the tank circuit and wherein the resonant frequency is tunable; and
   a tank controller coupled to the tank circuit, the tank controller configured to generate a control signal using a phase of an output of the amplifier and using a phase of a reference signal having a reference frequency, and wherein the resonant frequency is determined using the control signal.

2. The circuit of claim 1 further including an oscillator configured to provide the reference signal.

3. The circuit of claim 1 further including a synthesizer configured to provide the reference signal.

4. The circuit of claim 1 wherein the tank circuit includes a varactor.

5. The circuit of claim 4 wherein the tank circuit includes a magnetically tuned inductor.

6. The circuit of claim 4 wherein the tank circuit includes a transmission line.

7. The circuit of claim 4 wherein the tank circuit includes an active circuit.

8. The circuit of claim 1 wherein the tank circuit includes at least one of a variable inductor and a variable capacitor.

9. The circuit of claim 1 wherein the amplifier includes a low noise amplifier.

10. The circuit of claim 1 wherein the amplifier includes an input stage having a common gate (CG) configuration, a common source (CS) configuration, a common drain (CD) configuration, or a capacitor cross coupled common gate configuration.

11. The circuit of claim 1 wherein the amplifier includes a single-ended output.

12. The circuit of claim 1 wherein the amplifier includes a single-ended input.

13. The circuit of claim 1 wherein the amplifier includes a differential output.

14. The circuit of claim 1 wherein the amplifier includes a differential input.

15. The circuit of claim 1 wherein the tank controller is configured to generate a direct current (DC) control signal.

16. The circuit of claim 1 wherein the tank controller is configured to generate a digital control signal.

17. The circuit of claim 1 wherein the tank controller includes a phase detector.

18. The circuit of claim 1 wherein the tank controller includes a loop filter.

19. A system comprising:
   an amplifier having an amplifier output;
   a tank circuit coupled to the amplifier and having a variable resonant frequency and having a tuning input, wherein a particular resonant frequency is selectable using a signal at the tuning input, and wherein a center frequency of the amplifier is determined using the resonant frequency; and
   a controller coupled to the amplifier output and having a controller output determined using a phase of the amplifier output and using a phase of a reference signal having a reference frequency, and further wherein the controller output is coupled to the tuning input.

20. The system of claim 19 wherein the controller includes a filter.

21. The system of claim 19 wherein the controller output uses a signal that is proportional to a phase between the amplifier output and a phase of the reference frequency.

22. The system of claim 19 wherein the controller includes a phase detector.

23. The system of claim 19 wherein the controller includes a quadrature mixer.

24. The system of claim 19 wherein the controller includes a phase shifter.

25. The system of claim 19 wherein the tank circuit includes at least one of a varactor, a switched capacitor, a tunable capacitor, a switched inductor, and a tunable inductor.

26. The system of claim 19 wherein the reference signal is provided by a phase locked loop (PLL) circuit and further wherein a loop time constant of the controller is faster than a loop constant of a synthesizer of the PLL circuit.

27. The system of claim 19 wherein the reference signal is provided by a circuit including a phase shifter.

28. The system of claim 19 wherein the reference signal is provided by a circuit having a slew rate limited such that a gain of the controller remains above a selected level.

29. The system of claim 19 further including a frequency divider coupled to the controller, and wherein the controller output is determined using a sub-harmonic of a target frequency.

30. A method comprising:
- generating an output signal using an amplifier and a test signal, the test signal having a reference frequency;
- generating a control signal using a phase of the output signal and a phase of the test signal; and
- selecting a particular resonant frequency for a tank circuit using the control signal, the tank circuit coupled to the amplifier and wherein a center frequency of the amplifier is determined using the particular resonant frequency.

31. The method of claim 30 wherein generating the output signal includes at least one of receiving a radio frequency (RF) signal at the amplifier and receiving a microwave signal at the amplifier.

32. The method of claim 30 wherein generating the control signal includes mixing the output signal and the reference frequency.

33. The method of claim 30 wherein generating the control signal includes filtering.

34. The method of claim 30 further including adjusting the particular resonant frequency.

35. The method of claim 34 wherein adjusting the particular resonant frequency includes adjusting at least one of an inductance and a capacitance.

36. The method of claim 30 further including receiving the test signal from a oscillator.

37. The method of claim 30 further including receiving the test signal from a synthesizer.

38. The method of claim 30 wherein generating the control signal includes selecting a gain using an amplitude of the output signal.

39. The method of claim 30 wherein the particular resonant frequency is selected such that the center frequency and the reference frequency are substantially matched.

40. The method of claim 30 wherein the amplifier includes a plurality of gain stages coupled in series, each gain stage having a center frequency determined by a corresponding tank circuit, and wherein a center frequency of each gain stage is adjustable independent of another gain stage of the plurality of gain stages, and further including determining the center frequency of the amplifier by sequentially selecting the particular resonant frequency for each tank circuit in an order proceeding from a last gain stage to a first gain stage in the series of gain stages.

41. The method of claim 30 wherein the amplifier includes a plurality of gain stages coupled in series, each gain stage having a center frequency determined by a corresponding tank circuit, and wherein a center frequency of each gain stage is adjustable independent of another gain stage of the plurality of gain stages, and further including determining the center frequency of the amplifier by simultaneously injecting the test signal at each gain stage.

42. A method comprising:
- providing a tank circuit having a resonant frequency selectable using a control signal on a control line;
- coupling the tank circuit to an amplifier having a center frequency, wherein the center frequency is determined using the resonant frequency; and
- providing a tank controller having a control output coupled to the control line and a first input coupled to a test signal and a second input coupled to an output of the amplifier, the tank controller configured to provide a control signal on the control output proportional to a phase between a reference frequency of the test signal and a frequency on the amplifier output.

43. The method of claim 42 wherein providing the tank circuit includes providing at least one of a varactor, a capacitor, and an inductor.

44. The method of claim 42 wherein providing the tank controller includes providing at least one of a phase detector, a phase shifter, and a loop filter.

45. The method of claim 42 wherein a particular resonant frequency is selected such that the center frequency and the reference frequency are substantially matched.

* * * * *

UNITED STATES PATENT AND TRADEMARK OFFICE
CERTIFICATE OF CORRECTION

Page 1 of 1

PATENT NO.        : 7,917,117 B2
APPLICATION NO.   : 12/020805
DATED             : March 29, 2011
INVENTOR(S)       : Steven Zafonte et al.

It is certified that error appears in the above-identified patent and that said Letters Patent is hereby corrected as shown below:

In column 1, line 8, below "amplifier." insert

-- GOVERNMENT FUNDING

This invention was made with government support under grant number FA9453-07-1-0211 awarded by the Air Force Office of Scientific Research. The government has certain rights in the invention. --.

Signed and Sealed this
Sixteenth Day of August, 2011

David J. Kappos
*Director of the United States Patent and Trademark Office*